(12) United States Patent
Zhang et al.

(10) Patent No.: US 10,971,779 B2
(45) Date of Patent: Apr. 6, 2021

(54) HOLDING DEVICE, ELECTRONIC DEVICE ASSEMBLY, AND ELECTRONIC APPARATUS

(71) Applicant: Wistron Corp., New Taipei (TW)

(72) Inventors: Rong Jin Zhang, New Taipei (TW);
Shu Tong Jiang, New Taipei (TW);
Xiong Jie Yao, New Taipei (TW);
Chang-Feng Lan, New Taipei (TW)

(73) Assignee: WISTRON CORP., New Taipei (TW)

( * ) Notice: Subject to any disclaimer, the term of this patent is extended or adjusted under 35 U.S.C. 154(b) by 0 days.

(21) Appl. No.: 16/451,264

(22) Filed: Jun. 25, 2019

(65) Prior Publication Data

US 2020/0303693 A1    Sep. 24, 2020

(30) Foreign Application Priority Data

Mar. 21, 2019   (CN) .......................... 201910217024.5

(51) Int. Cl.
*H01M 50/20* (2021.01)
*G06F 1/16* (2006.01)
*H05K 7/14* (2006.01)

(52) U.S. Cl.
CPC .............. *H01M 50/20* (2021.01); *G06F 1/16* (2013.01); *H05K 7/1401* (2013.01)

(58) Field of Classification Search
None
See application file for complete search history.

(56) References Cited

U.S. PATENT DOCUMENTS

| 6,373,693 | B1 * | 4/2002 | Seto | G06F 1/1616 |
| | | | | 361/679.33 |
| 6,530,804 | B1 * | 3/2003 | Wu | H01M 2/1055 |
| | | | | 439/500 |
| 7,512,397 | B2 * | 3/2009 | Liu | H04B 1/3883 |
| | | | | 361/616 |
| 2004/0214077 | A1 * | 10/2004 | Huang | H01M 2/1066 |
| | | | | 429/97 |
| 2004/0253508 | A1 * | 12/2004 | Kohri | H04M 1/0262 |
| | | | | 429/100 |
| 2008/0042448 | A1 * | 2/2008 | Ge | E05C 1/10 |
| | | | | 292/137 |

(Continued)

FOREIGN PATENT DOCUMENTS

TW          M442001 U      11/2012

OTHER PUBLICATIONS

Taiwan Patent Office, "Office Action", dated Apr. 10, 2020, Taiwan.

*Primary Examiner* — Courtney L Smith

(74) *Attorney, Agent, or Firm* — Locke Lord LLP; Tim Tingkang Xia, Esq.

(57) ABSTRACT

The disclosure relates to a holding device and an electronic device assembly and an electronic apparatus having the same. The holding device is able to hold an insertion device. At least one holding structure of the holding device includes a first holding portion and a second holding portion, and the second holding portion is located closer to the insertion opening than the first holding portion. The first holding portion is configured to hold the insertion device at an installed position, and the second holding portion is configured to hold the insertion device at a non-installed position.

16 Claims, 7 Drawing Sheets

(56) References Cited

U.S. PATENT DOCUMENTS

| | | | | |
|---|---|---|---|---|
| 2008/0100262 A1* | 5/2008 | Ozaki | ................ | H04M 1/0262 |
| | | | | 320/112 |
| 2008/0253065 A1* | 10/2008 | Lai | ..................... | G06F 1/1658 |
| | | | | 361/679.01 |
| 2009/0186262 A1* | 7/2009 | Takahashi | ............. | H01M 2/22 |
| | | | | 429/90 |
| 2010/0119923 A1* | 5/2010 | Wu | ................ | H01M 2/1066 |
| | | | | 429/97 |
| 2013/0088815 A1* | 4/2013 | Hu | ................... | H04B 1/3888 |
| | | | | 361/679.01 |
| 2015/0171401 A1* | 6/2015 | Kim | ................ | H01M 2/204 |
| | | | | 429/158 |

\* cited by examiner

HOLDING DEVICE, ELECTRONIC DEVICE ASSEMBLY, AND ELECTRONIC APPARATUS

CROSS-REFERENCE TO RELATED APPLICATIONS

This non-provisional application claims priority under 35 U.S.C. § 119(a) on Patent Application No(s). 201910217024.5 filed in China on Mar. 21, 2019, the entire contents of which are hereby incorporated by reference.

TECHNICAL FIELD

The disclosure relates to a holding device, more particularly to a holding device, and an electronic device assembly and an electronic apparatus having the same.

BACKGROUND

Nowadays, mobile communication devices, such as mobile phones, have become one of the indispensable electronic products and are widely used in various fields. For example, in addition to the phones for general consumers, there are also an industrial mobile phone designed for special occasions, such as industrial machinery factories, warehouses or construction sites. Due to the special requirements of these occasions, the industrial mobile phone may need to be used in high noise environments or equipped with some features, such as a scanner for scanning the goods, a powerful flashlight, or a high waterproof casing. In addition, the industrial mobile phone might be used to communicate very often, so the battery life is also an important topic to this type of phone.

Conventionally, such handheld electronic apparatus (e.g., the industrial mobile phone) has a battery slot for the insertion of battery, and it also contains a fixing mechanism to fix the battery in position. At the same time, to release the battery, there is a release button on the industrial mobile phone so that the user is able to press it to make the fixing mechanism release the battery. However, usually, the user needs to hold the industrial mobile phone for a long time to perform the scanning process or to communicate with other colleagues. Therefore, the user may easily activate the release button to unintentionally release the battery so that the battery is often accidentally dropping from the mobile phone. As a result, the battery is easily missing and being damaged if it falls on the ground, resulting in suspension of construction work and increasing equipment costs.

SUMMARY

One embodiment of the disclosure provides an electronic device assembly including a holding device and an insertion device. The holding device includes a casing and at least one holding structure. The casing has an insertion opening. Each of the at least one holding structure includes a first holding portion and a second holding portion, wherein the second holding portion is located closer to the insertion opening than the first holding portion. At least part of the insertion device is configured to be removably accommodated in the casing so that the insertion device has an installed position and a non-installed position. The insertion device includes a device main body and at least one engaging component, the at least one engaging component is connected to the device main body, the first holding portion of the at least one holding structure is configured to engage with the at least one engaging component of the insertion device so as to hold the insertion device at the installed position; and the second holding portion of the at least one holding structure is configured to engage with the at least one engaging component of the insertion device so as to hold the insertion device at the non-installed position.

One embodiment of the disclosure provides a holding device configured to hold an insertion device so that the insertion device has an installed position and a non-installed position. The holding device includes a casing and at least one holding structure. The casing has an insertion opening, wherein the casing is configured to accommodate at least part of the insertion device. Each of the at least one holding structure includes a first holding portion and a second holding portion, the second holding portion is located closer to the insertion opening than the first holding portion; wherein the first holding portion of the at least one holding structure is configured to engage with the insertion device so as to hold the insertion device at the installed position; and the second holding portion of the at least one holding structure is configured to engage the insertion device so as to hold the insertion device at the non-installed position.

One embodiment of the disclosure provides an electronic apparatus, configured to hold an insertion device so that the insertion device has an installed position and a non-installed position. The electronic apparatus includes a casing, at least one holding structure and a processing unit. The casing has an insertion opening, wherein the casing is configured to accommodate at least part of the insertion device. Each of the at least one holding structure comprising a first holding portion and a second holding portion, the second holding portion is located closer to the insertion opening than the first holding portion; wherein the first holding portion of the at least one holding structure is configured to engage with the insertion device so as to hold the insertion device at the installed position; and the second holding portion of the at least one holding structure is configured to engage with the insertion device so as to hold the insertion device at the non-installed position. The processing unit is disposed in the casing, when the insertion device is in the installed position, the insertion device is electrically connected to the processing unit.

BRIEF DESCRIPTION OF THE DRAWINGS

The present disclosure will become better understood from the detailed description given hereinbelow and the accompanying drawings which are given by way of illustration only and thus are not intending to limit the present disclosure and wherein.

DETAILED DESCRIPTION

Figure 1:
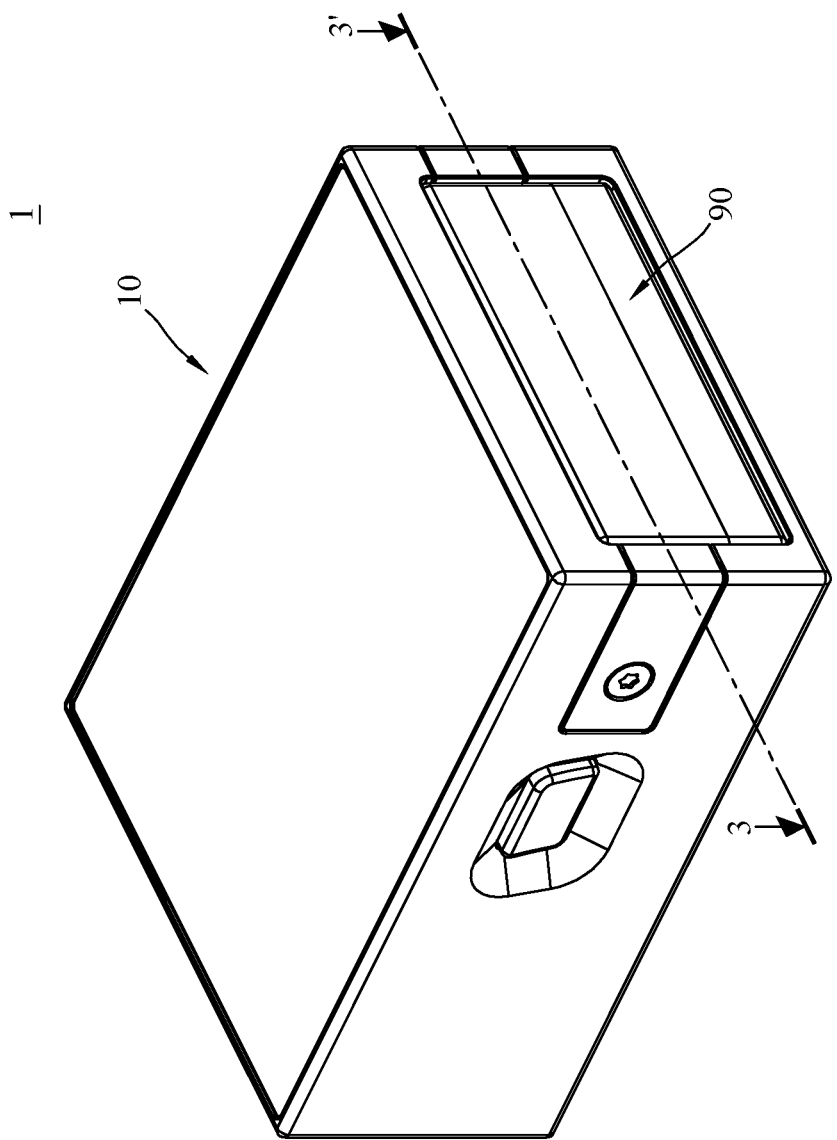
FIG. 1 is a perspective view of an electronic device assembly according to one embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In addition, the terms used in the present disclosure, such as technical and scientific terms, have its own meanings and can be comprehended by those skilled in the art, unless the terms are additionally defined in the present disclosure. That is, the terms used in the following paragraphs should be read on the meaning commonly used in the related fields and will not be overly explained unless the terms have a specific meaning in the present disclosure. Furthermore, in order to simplify the drawings, some conventional structures and components are drawn in a simplified manner to keep the drawings clean.

Further, the following embodiments are disclosed by the figures, and some practical details are described in the following paragraphs, but the present disclosure is not limited thereto. Furthermore, for the purpose of illustration, some of the structures and components in the figures are simplified, and wires, lines or buses are omitted in some of the figures. And the size, ratio, and angle of the components in the drawings of the present disclosure may be exaggerated for illustrative purposes, but the present disclosure is not limited thereto, and various modifications are allowed and can be made according to the following disclosure as long as it does not depart from the spirit of the present disclosure. Note that the actual size and designs of the product manufactured based on the present disclosure may also be modified according to any actual requirements.

Further, the terms, such as "end", "portion", "part", "area" and the like may be used in the following to describe specific components and structures or specific features thereon or therebetween, but are not intended to limit these components and structures. In the following, it may use terms, such as "substantially", "approximately" or "about"; when these terms are used in combination with size, concentration, temperature or other physical or chemical properties or characteristics, they are used to express that, the deviation existing in the upper and/or lower limits of the range of these properties or characteristics or the acceptable tolerances caused by the manufacturing tolerances or analysis process, would still able to achieve the desired effect.

Furthermore, unless otherwise defined, all the terms used in the disclosure, including technical and scientific terms, have their ordinary meanings that can be understood by those skilled in the art. Moreover, the definitions of the above terms are to be interpreted as being consistent with the technical fields related to the disclosure. Unless specifically defined, these terms are not to be construed as too idealistic or formal meanings. The terms of the components in the disclosure are sometimes referred to in a more concise manner, depending on the requirements of the description, and should be understood by the reader.

Figure 2:
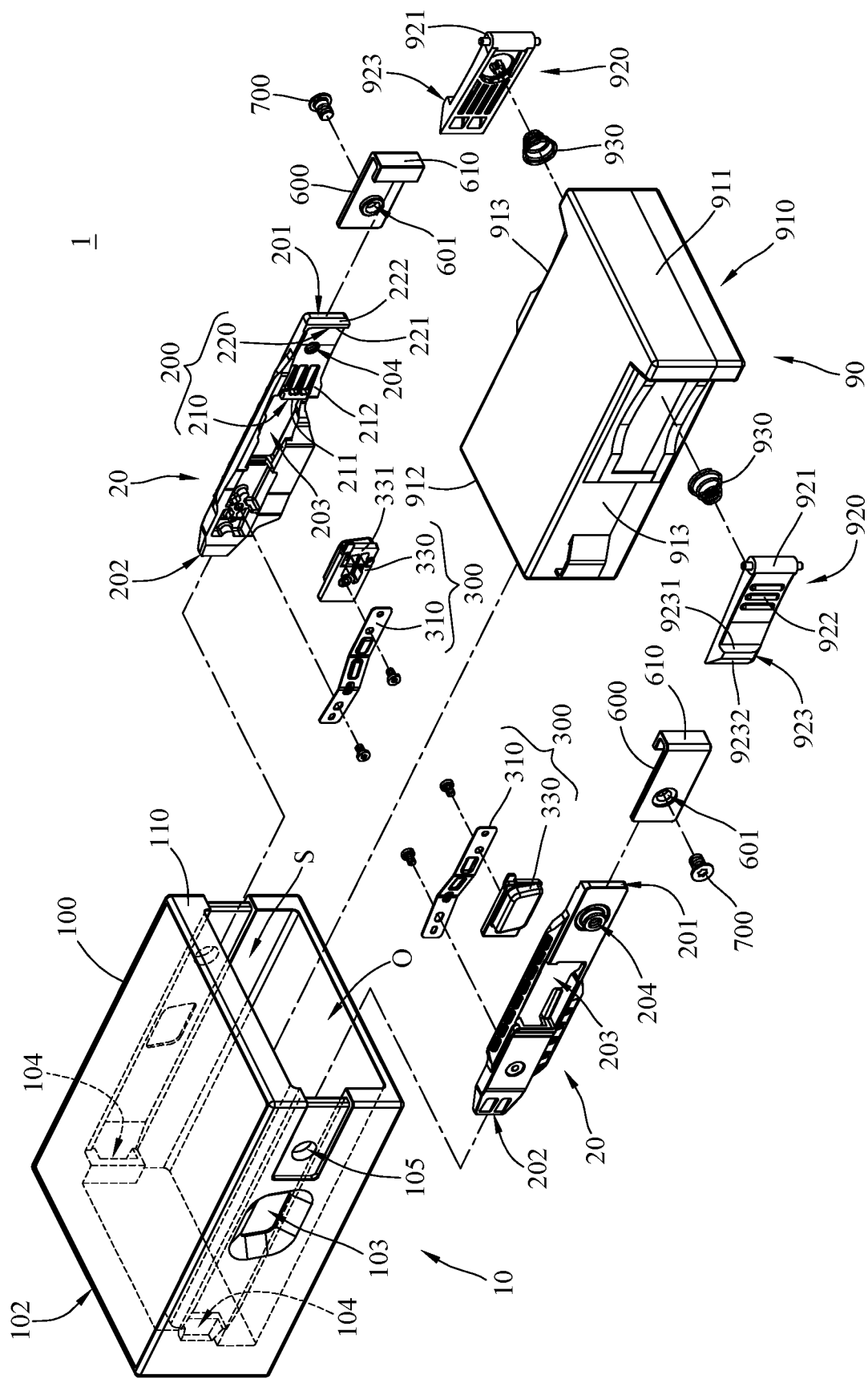
FIG. 2 is an exploded view of the electronic device assembly in FIG. 1.
Figure 3:
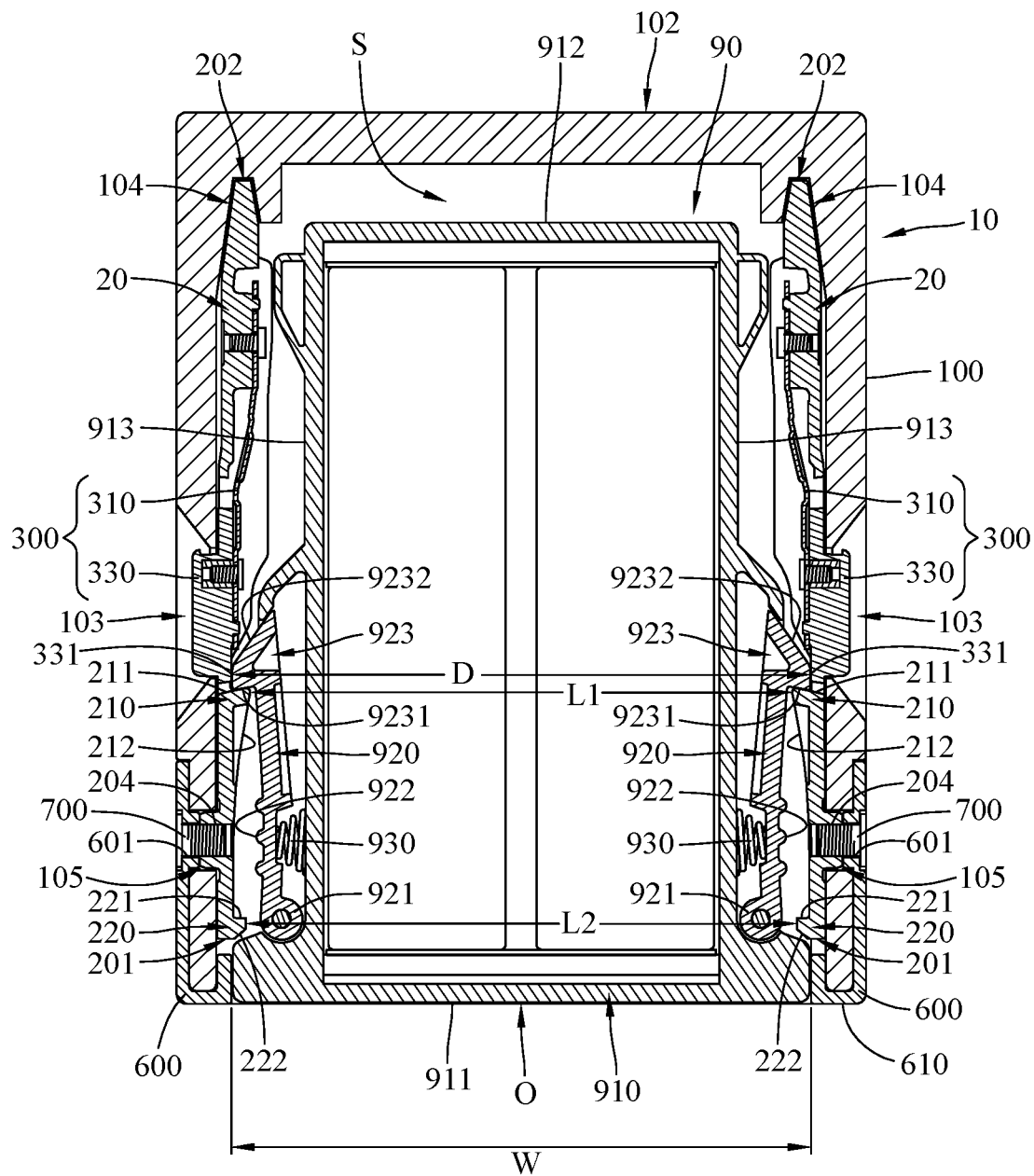
FIG. 3 is a cross-sectional view of the electronic device assembly in FIG. 1 taken along line 3-3'.

Firstly, please refer to FIG. 1 to FIG. 3, FIG. 1 is a perspective view of an electronic device assembly according to one embodiment of the disclosure, FIG. 2 is an exploded view of the electronic device assembly in FIG. 1, and FIG. 3 is a cross-sectional view of the electronic device assembly in FIG. 1 taken along line 3-3'.

Figure 7:
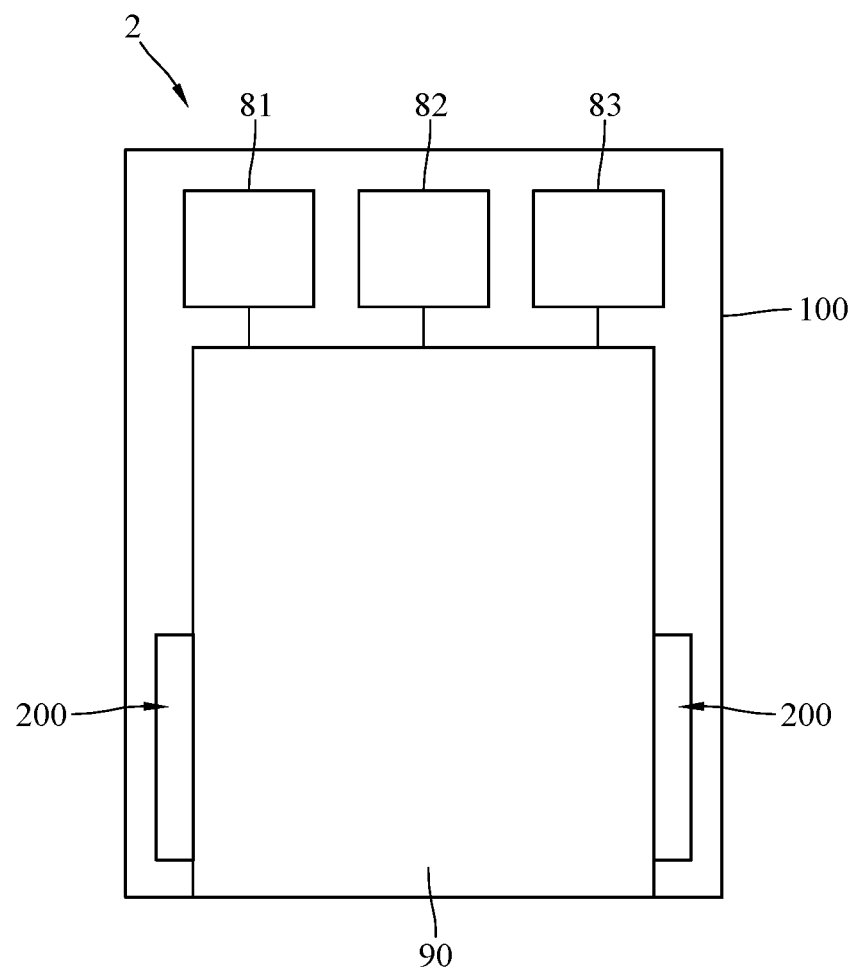
FIG. 7 is a simple diagram of an electronic apparatus according to one embodiment of the disclosure.

As shown in FIG. 1 and FIG. 2, this embodiment provides an electronic device assembly 1 that is able to cooperate with one or more electronic components, such as a processing unit or memory, or one or more electronic device, such as a display, to constitute an electronic apparatus (e.g., a processing unit 81, memory 82 and display 83 of an electronic apparatus 2 in FIG. 7). The said electronic apparatus may be, but not limited to, a handheld electronic product, and the quantity and type of the aforementioned electronic component and electronic device can be altered according to the actual requirements of the electronic apparatus, and the disclosure is not limited thereto.

The electronic device assembly 1 are described in detail hereinafter. In this embodiment or some other embodiments, the electronic device assembly 1 includes a holding device 10 that is able to hold an insertion device 90 in position. Specifically, the holding device 10 is configured to accommodate at least part of the insertion device 90 so that the said insertion device 90 is able to be inserted into or taken out from the holding device 10. In the exemplary embodiment, the insertion device 90 is a battery. As the insertion device 90 is installed in position, it is electrically connected to the aforementioned processing unit, memory and display panel and is able to provide electricity to them. However, the principles disclosed herein are also applicable to other types of insertion devices. In other words, although the exemplary embodiment is discussed below with reference to a battery, exemplary embodiments are not limited in this regard and are equally applicable to other types of insertion device without departing from the spirit and scope of the disclosure. For example, in some other embodiments, the insertion device 90 may be a memory card. It is also noted that the insertion device 90 may or may not have a portion not in the holding device 10 when the insertion device 90 is 'accommodated in' the holding device 10; that is, the insertion device 90 can be fully or partially accommodated in the holding device 10, and the disclosure is not limited thereto.

In this embodiment or some other embodiments, most part of the insertion device 90 can be accommodated in the holding device 10, and the insertion device 90 can be in an installed position or a non-installed position when it is held by the holding device 10. The said installed position of the insertion device 90 is shown in FIG. 1, at this moment, the insertion device 90 is fixed in a position that is electrically connected to the aforementioned processing unit and other components and able to provide its function. In the case that the insertion device 90 is a battery, the insertion device 90, in the installed position, can be electrically connected to the internal circuits of the electronic apparatus where the electronic device assembly 1 is installed to provide electricity to the electronic apparatus (e.g., the electronic apparatus 2 in FIG. 7). Note that the disclosure is not limited to how the insertion device 90 is electrically connected and how the insertion device 90 provides its function.

Figure 5:
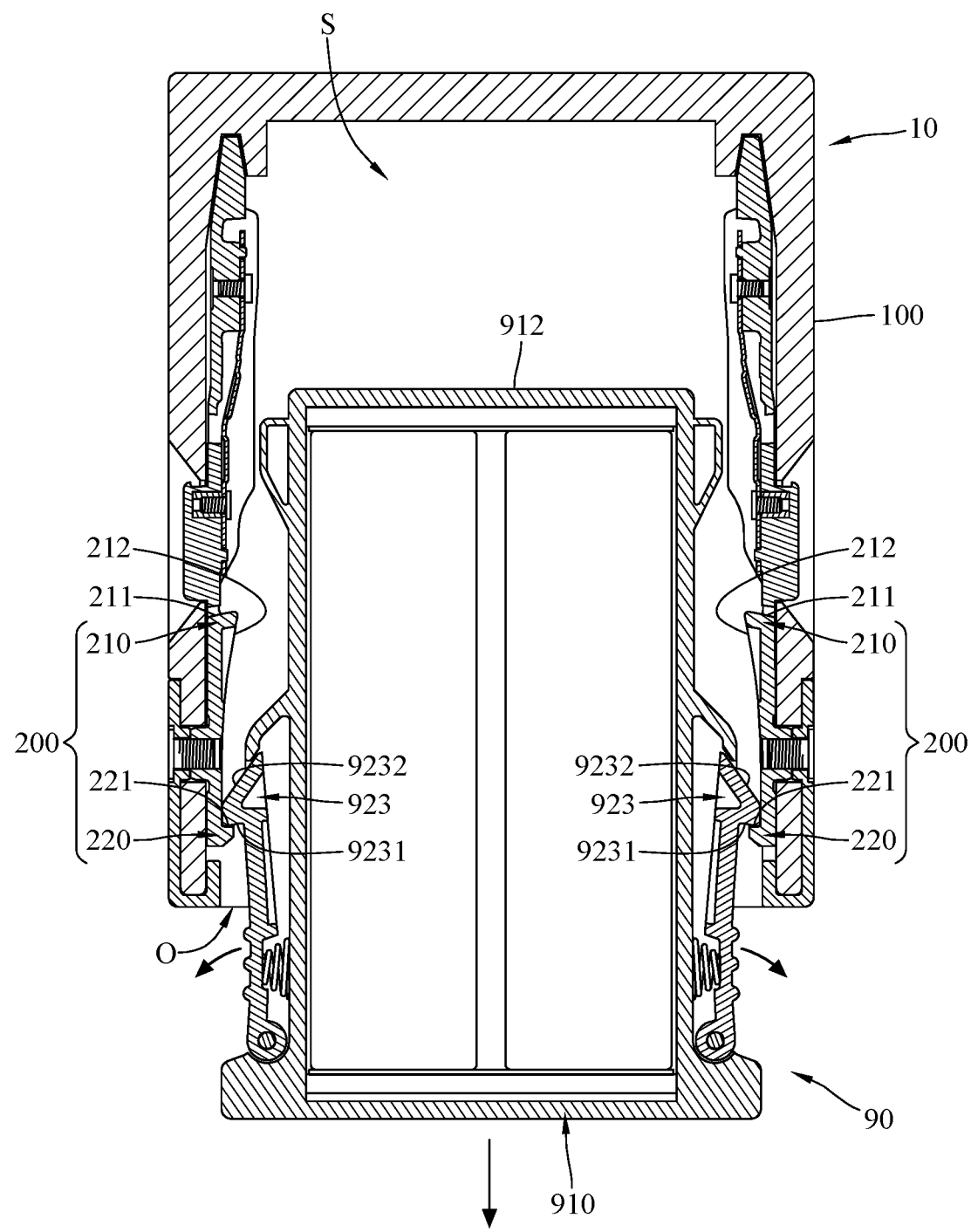
FIG. 5 is a cross-sectional view of the insertion device in FIG. 4 when the insertion device is moved toward an insertion opening from the installed position.

When the insertion device 90 is accidentally or unwantedly released from the installed position, the holding device 10 is able to hold the insertion device 90 in the non-installed position so as to prevent the insertion device 90 from directly falling out of the holding device 10. The said non-installed position of the insertion device 90 is shown in FIG. 5, at this moment, part of the insertion device 90 is located outside of the holding device 10 but the insertion device 90 is still held by the holding device 10. Note that the disclosure is not limited to the amount that the insertion device 90 protrudes from the holding device 10 when the insertion device 90 is in the non-installed position. And the insertion device 90 will not be electrically connected to the aforementioned processing unit when it is in the non-installed position.

Then, the holding device 10, the insertion device 90 and their connection will be described in detail in the following paragraphs so as to specifically explain how the insertion device 90 prevents the holding device 10 from falling out.

In this embodiment or some other embodiments, the holding device 10 may include a casing 100 and at least one holding structure 200 disposed on the casing 100. The casing 100 has an insertion opening O. The aforementioned insertion device 90 can be inserted into or taken out of the casing 100 of the holding device 10 via the insertion opening O. As shown in the FIGS. 2 and 3, the casing 100 has an accommodation space S for accommodating at least part of the insertion device 90. The accommodation space S is connected to the insertion opening O so that the accommodation space S can be exposed and connected to the external environment from the insertion opening O. The side of the casing 100 which is closed and opposite the insertion opening O can be referred to as a closed side 102 of the casing 100. In addition, the shape and size of the insertion opening O and accommodation space S can be altered according to the shape of the insertion device 90 or other requirements, and the disclosure is not limited thereto.

In this embodiment, the holding device 10 has two holding structures 200, and the two holding structures 200 are respectively located at two opposite sides of the accommodation space S of the casing 100. The two holding structures 200 are substantially symmetrical in configuration, so only one of the holding structures 200 will be described in detail hereinafter. In this embodiment, each holding structure 200 has a first holding portion 210 and a second holding portion 220, where the first holding portion 210 is located further away from the insertion opening O of the casing 100 than the second holding portion 220; in other words, the second holding portion 220 is located closer to the insertion opening O of the casing 100 than the first holding portion 210.

As shown in FIG. 3, a distance between the first holding portions 210 of the two holding structures 200 is defined to be a first distance L1, a distance between the second holding portions 220 of the two holding structures 200 is defined to be a second distance L2, and a width of the insertion opening O of the casing 100 is defined to be an insertion opening width W. In this embodiment, the disclosure is not limited to the relationship between the first distance L1 and the second distance L2, but both of the first distance L1 and the second distance L2 are at least smaller than the insertion opening width W; that is, L1, L2, and W at least satisfy the following condition: L1<W; L2<W.

Therefore, when the insertion device 90, as shown in FIG. 1, is in the installed position, the insertion device 90 is engaged with the first holding portions 210 so that the insertion device 90 is held in the installed position by the first holding portions 210. When the insertion device 90 is accidentally or unwantedly disengaged from the first holding portions 210 and moving outward through the insertion opening O, the second holding portions 220 will then stop and hold the insertion device 90 at the non-installed position (as shown in FIG. 5) so as to prevent the insertion device 90 from directly falling out of the casing 100.

However, the disclosure is not limited to the relationship among L1, L2, and W. In another embodiment, according to the different locations of the first holding portion 210 and the second holding portion 220 or the different size of the insertion opening O, the first distance L1 and the second distance L2 may be adjusted to be the same as the insertion opening width W, that is, L1=W, and L2=W.

In addition, in this embodiment or some other embodiments, the casing 100 may further have two exposure holes 103, two insertion slots 104, and two fixing holes 105. The exposure holes 103 are respectively located at two opposite sides of the casing 100, the insertion slots 104 are respectively located at two opposite sides of the casing 100, and the fixing holes 105 are also respectively located at two opposite sides of the casing 100. Therefore, the casing 100 has two groups of exposure hole 103, insertion slot 104 and fixing hole 105, and these groups are substantially symmetrical in configuration and respectively located at two opposite sides of the casing 100, so only one of the groups will be described in detail hereinafter.

The exposure hole 103 penetrates through the casing 100 and connects the accommodation space S, such that the accommodation space S can be exposed from the exposure hole 103. The insertion slot 104 is located on the inner wall of the casing 100. And the fixing hole 105 also penetrates through and connects the accommodation space S, such that the accommodation space S can be exposed from the fixing hole 105. The fixing hole 105 is located closer to the insertion opening O of the casing 100 than the exposure hole 103 and the insertion slot 104, and the exposure hole 103 is located closer to the insertion opening O of the casing 100 than the insertion slot 104; that is, in the group of the exposure hole 103, the insertion slot 104 and the fixing hole 105, the fixing hole 105 is most close to the insertion opening O of the casing 100, the insertion slot 104 is most away from the insertion opening O of the casing 100, and the exposure hole 103 is located between the insertion slot 104 and the fixing hole 105.

In addition, in this embodiment, the holding device 10 includes two holding components 20 and two releasing components 300 that are disposed on the casing 100, where one holding component 20 and one releasing component 300 are set to be a group. Therefore, in this embodiment, the holding device 10 has two groups of holding component 20 and releasing component 300, and these groups are substantially symmetrical in configuration and respectively located at two opposite sides of the casing 100, so only one of the groups will be described in detail hereinafter.

The aforementioned holding structure 200 may be, but not limited to, part of the holding component 20; that is, the holding structure 200 is integrally formed on the holding component 20. In other words, the first holding portion 210 and the second holding portion 220 are integrally formed on the holding component 20, but the disclosure is not limited thereto. In some other embodiments, the holding structure may be integrally formed on the casing; or in another embodiment, the holding structure may be additionally mounted on the holding component; or in yet another embodiment, the first holding portion and the second holding portion may be two independent objects that are additionally mounted on the holding structure.

In this embodiment, the holding component 20 is disposed on the inner side of the casing 100 and located in the accommodation space S, and the holding component 20 has an outer end 201 and an inner end 202 opposite to each other. The holding structure 200 is located closer to the outer end 201 than the inner end 202. The inner end 202 of the holding component 20 can be inserted into the insertion slot 104 of the casing 100, such that the holding component 20 can be fixed in the accommodation space S of the casing 100.

In more detail, in this embodiment or some other embodiments, the holding component 20 may further have an exposure hole 203 and a fixing hole 204. The fixing hole 204 is located closer to the outer end 201 of the holding component 20 than the exposure hole 203; in other words, the exposure hole 203 is located closer to the inner end 202 of the holding component 20 than the fixing hole 204. When the inner end 202 of the holding component 20 is inserted into the insertion slot 104 of the casing 100 so as to be fixed in the accommodation space S of the casing 100, the exposure hole 203 and the fixing hole 204 of the holding component 20 are respectively aligned with and connected to the exposure hole 103 and the fixing hole 105 of the casing 100, such that the accommodation space S can be exposed from the exposure hole 203 of the holding component 20 and the exposure hole 103 of the casing 100, and a screw (e.g., the fastener 700 shown in the figures) can be screwed into the fixing hole 105 and the fixing hole 204 to fix the holding component 20 onto the casing 100. By doing so, the outer end 201 and inner end 202 of the holding component 20 are fixed in position on the casing 100.

In this embodiment or some other embodiments, the releasing component 300 may include an elastic arm 310 and a press block 330. The elastic arm 310 is flexible and elastic, the elastic arm 310 can be deformed by a certain amount of external force applied thereon, and the elastic arm 310 can recover to its original shape when the external force is canceled. In this embodiment, one end of the elastic arm 310 is immovably fixed to an area of the holding component 20 near the inner end 202, and the one end of the elastic arm 310 can be considered as a fixed end of the elastic arm 310; and another end of the elastic arm 310 is movably located above the holding component 20, and the another end of the elastic arm 310 can be considered as a free end of the elastic arm 310. As shown in the figure, the press block 330 is disposed on the free end of the elastic arm 310 and is movably located in and exposed from the exposure hole 203 of the holding component 20 and the exposure hole 103 of the casing 100, allowing the user to touch or push the press block 330 with finger or other means. When a certain amount of external force is applied to push the press block 330 inward, it also forces the elastic arm 310 to deform. In addition, the press block 330 has a pushing portion 331, and the pushing portion 331 is configured to push the insertion device 90 to disengage the insertion device 90 from the installed position. The pushing portion 331 is located at a side of the first holding portion 210 away from the second holding portion 220. When the user uses finger or other tool to penetrate through the exposure hole 103 of the casing 100 to push the press block 330, the pushing portion 331 can be moved inward.

Then, regarding the insertion device 90, in this embodiment or some other embodiments, the insertion device 90 may include a device main body 910 and at least one engaging component 920. The device main body 910 of the insertion device 90 is configured to provide the required function (e.g., electricity) to the electronic apparatus. In FIGS. 2 and 3, the device main body 910 has four different sides that can be referred as a first side 911, a second side 912 and two lateral sides 913 opposite to each other. When the device main body 910 is inserted into the casing 100, the first side 911 can be considered as the outer side of the device main body 910, the second side 912 can be considered as the inner side of the device main body 910, such that the first side 911 can referred as an outer side 911, and the second side 912 can referred as an inner side 912.

Figure 4:
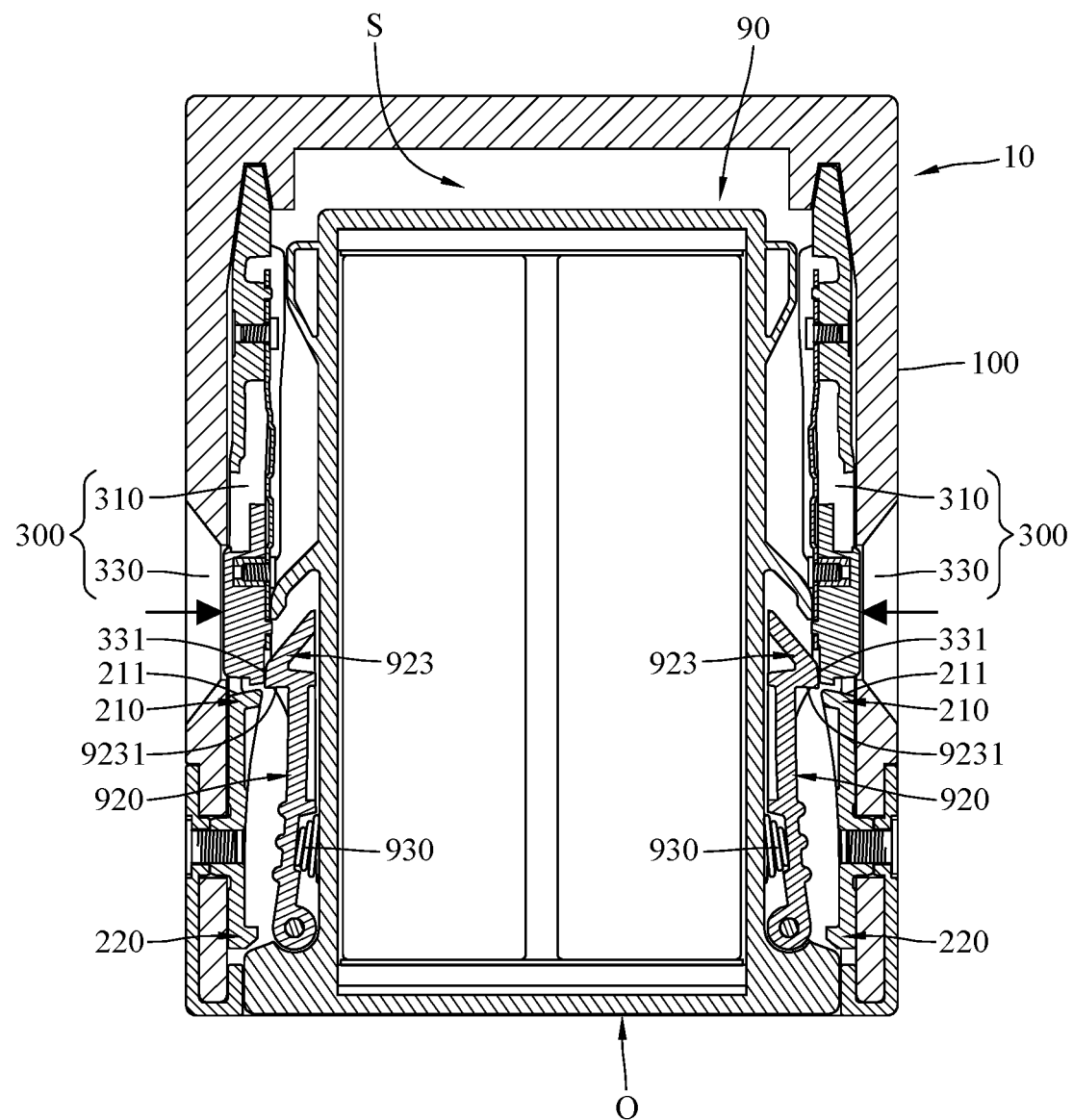
FIG. 4 is a cross-sectional view of an insertion device in FIG. 3 when the insertion device is about to be removed from an installed position.
Figure 6:
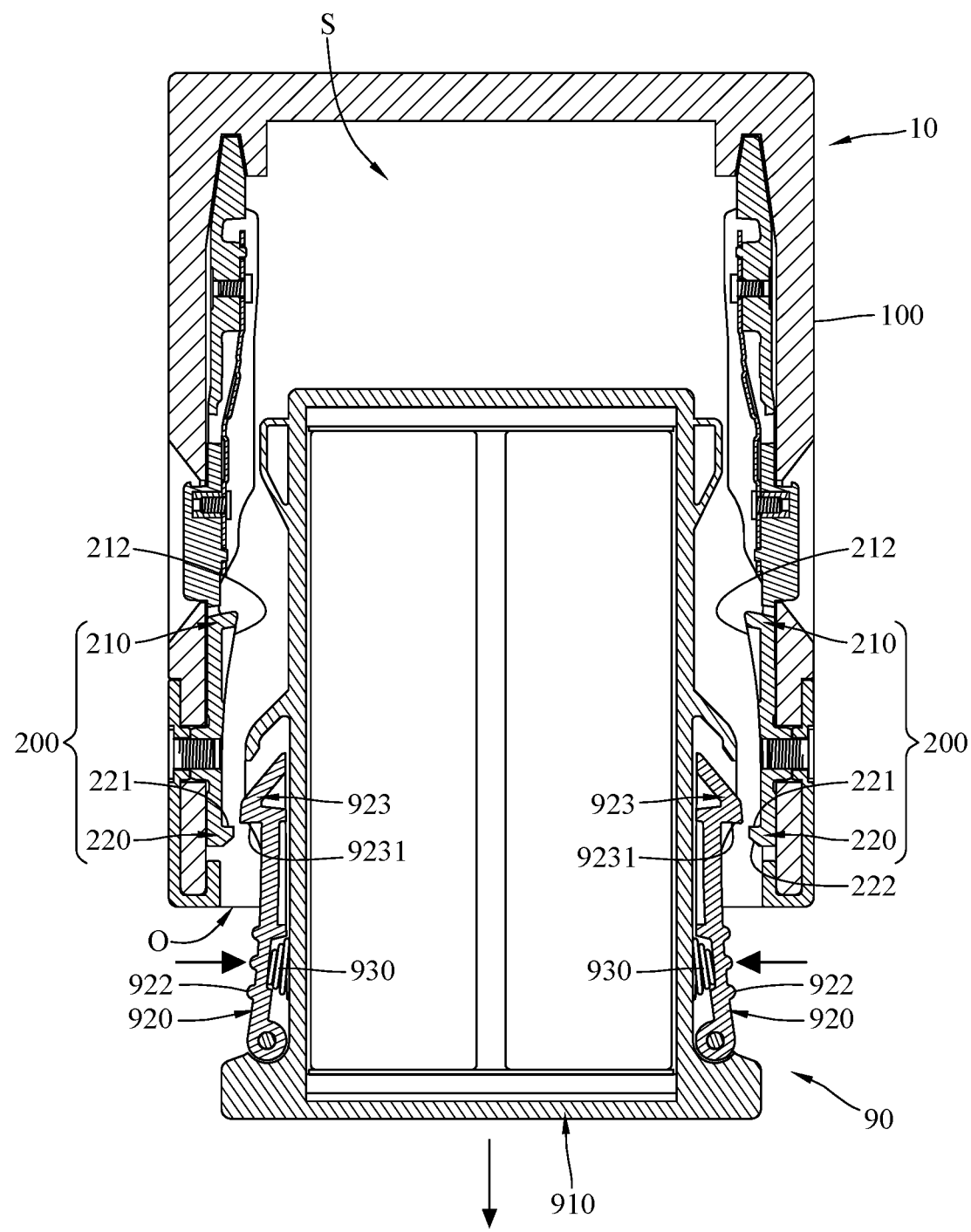
FIG. 6 is a cross-sectional view of the insertion device in FIG. 5 when the insertion device is about to be removed from a non-installed position.

In this embodiment, there are two engaging components 920 movably disposed on the lateral sides 913 of the device main body 910, and each engaging component 920 is movable between an engaged position (as shown in FIG. 3 or FIG. 5) and a disengaged position (as shown in FIG. 4 or FIG. 6). In addition, the engaging components 920 are substantially symmetrical in configuration, so only one of the engaging components 920 will be described in detail hereinafter.

In this embodiment, the engaging component 920 may include a connecting portion 921, a press portion 922 and an engaging portion 923, where the press portion 922 is located between and connected to the connecting portion 921 and the engaging portion 923; that is, the engaging portion 923 is connected to the connecting portion 921 via the press portion 922, and the press portion 922 is connected to the device main body 910 via the connecting portion 921. In this embodiment, the connecting portion 921 is movably disposed on the lateral side 913 of the device main body 910, such that the engaging portion 923 and the press portion 922 can also be movable relative to the device main body 910, such as moving toward or away from the lateral side 913 of the device main body 910, so as to switch the engaged position and the disengaged position of the engaging component 920. In detail, in this embodiment, the connecting portion 921 is pivotally connected to the lateral side 913 of the device main body 910, but the disclosure is not limited to the connection between the connecting portion 921 and the device main body 910, any design that can make the engaging component movably connected to the device main body should be considered to be an option of the connecting portion of the disclosure. For example, in some other embodiments, the connecting portion may be a structure that directly protrudes from the device main body; in such a case, the engaging component is still movable relative to the device main body due to the elastic property of the engaging component.

In addition, as shown in FIG. 3, the furthest distance between the outer sides of the engaging components 920 is defined as D, where said outer side of the engaging component 920 is the side of the engaging component 920 facing away from the device main body 910, and said furthest distance D means the largest distance between the outer sides of the engaging components 920 when the insertion device 90 is in the installed position, the non-installed position, or taken out from the holding device 10. In this embodiment, furthest distance D, the aforementioned first distance L1 between the first holding portions 210, and the aforementioned second distance L2 between the second holding portions 220 at least satisfy the following condition: L1<D; L2<D.

This ensures that the engaging components 920 to be in the engaged position to engage with the first holding portions 210 or the second holding portions 220 when the insertion device 90 is in the installed position or the non-installed position.

Further, the insertion device 90 may further include at least one elastic component 930. In this embodiment, there are two elastic components 930, and the two elastic components 930 are clamped between the engaging components 920 and the lateral sides 913 of the device main body 910. In this embodiment, each of the elastic components 930 is clamped between the press portion 922 of the engaging component 920 and the device main body 910 in order to force the engaging portion 923 and the press portion 922 to move away from the device main body 910; that is, the elastic component 930 is able to force the engaging component 920 to move toward the engaged position. Therefore, when no external force is applied to push inward the engaging component 920, the engaging component 920 is in an inclined position relative to the device main body 910 by the elastic component 930. As shown in FIG. 3, when no external force is applied to push inward the engaging components 920 and the insertion device 90 is in the installed position, at this moment, the engaging portions 923 of the engaging components 920 are engaged with the first holding portions 210 of the holding structures 200 of the holding device 10.

In more detail, the first holding portion 210 of the holding structure 200 of the holding device 10 has a first holding surface 211 facing away from the insertion opening O of the casing 100. The engaging portion 923 of the insertion device 90 has an engaging surface 9231 facing the outer side 911 of the device main body 910; in other words, the engaging surface 9231 faces the insertion opening O of the casing 100. Therefore, as shown in FIG. 3, when the insertion device 90 is in the installed position, the engaging portion 923 of the insertion device 90 holds the first holding surface 211 of the first holding portion 210 of the holding device 10 by the engaging surface 9231.

Then, please refer to FIG. 4, an external force can be applied to push the press blocks 330 inward so that the insertion device 90 is about to be released from the installed position, at this moment, the engaging components 920 of the insertion device 90 are moved toward the disengaged position. In detail, the user is able to press the press blocks 330 by, for example, fingers from the outside of the casing 100, the pushing portions 331 of the press blocks 330 are located at a side of the first holding portions 210 away from the second holding portions 220 so that the pushing portions 331 can push the engaging portions 923 of the engaging components 920 to disengage the engaging surfaces 9231 of the engaging component 920 from the first holding surfaces 211 of the first holding portions 210 of the holding device 10. By doing so, the insertion device 90 will be temporarily in a slidable state and able to be released from the installed position, and the elastic components 930 that are pressed by the engaging components 920 are compressed to store elastic potential energy.

Note that the user might accidentally or unintentionally press the press blocks 330 to cause the engaging surfaces 9231 of the engaging components 920 to disengage from the first holding surfaces 211 of the first holding portions 210 of the holding device 10, but the disclosure is not limited thereto. Whatever the reason causing the engaging components 920 to disengage from the first holding portions 210, while the insertion device 90 is moving outward from the installed position, the elastic components 930 of the insertion device 90 will timely release the stored elastic potential energy to force the engaging components 920 to return to the engaged position so that the engaging portions 923 of the engaging components 920 are moved away from the device main body 910 and engaged with the second holding portions 220 of the holding structure 200. As such, the insertion device 90 will be stopped at the non-installed position and prevented from falling out of the casing 100.

In detail, please refer to FIG. 3 and further refer to FIG. 5, FIG. 5 shows that the insertion device 90 is released from the installed position and moving outward via the insertion opening O. As shown in FIG. 3, the second holding portions 220 of the holding structures 200 of the holding device 10 each have a second holding surface 221, similar to the first holding surface 211 of the first holding portion 210, the second holding surface 221 also faces away from the insertion opening O of the casing 100. As shown in FIG. 5, when the insertion device 90 is released from the installed position and moving outward via the insertion opening O, the engaging surfaces 9231 of the engaging portions 923 of the insertion device 90 will be held by the second holding surfaces 221 of the second holding portions 220 of the holding device 10 so that the insertion device 90 will be stopped at the non-installed position and thus being prevented from falling out of the casing 100.

Therefore, when the insertion device 90 is accidentally or unwantedly detached from the installed position, the insertion device 90 can be held by the second holding portions 220 of the holding structures 200 of the holding device 10 and will not fall to the ground. This can prevent the insertion device 90 from missing or being damaged if it falls to the ground. Note that the reason that causes the insertion device 90 to release from the installed position and slide toward the non-installed position is not restricted and might be gravity or the motion of the whole device.

Then, the user can push the insertion device 90 back to the installed position or release the insertion device 90 from the non-installed position and take it out from the holding device 10.

The former case can be simply completed by applying force to push the insertion device 90 further into the accommodation space S. Specifically, in this embodiment or some other embodiments, the first holding portions 210 of the holding structures 200 of the holding device 10 each have a first inclined guide surface 212 facing away from the first inclined guide surface 212 but facing toward the insertion opening O of the casing 100, and the engaging portions 923 of the insertion device 90 each have an inclined contact surface 9232 facing away from the engaging surface 9231 and facing the inner side 912 of the device main body 910. As shown in FIG. 3 or FIG. 5, the inclined contact surface 9232 can be considered as to be facing away from the insertion opening O of the casing 100. As such, while the insertion device 90 is moving back to the installed position from the non-installed position, the inclined contact surfaces 9232 of the engaging portions 923 of the insertion device 90 will contact the first inclined guide surfaces 212 of the first holding portions 210 of the holding structure 200, such that the first holding portions 210 can force the engaging portions 923 of the engaging component 920 to move toward the lateral sides 913 of the device main body 910 and the elastic components 930 are compressed and storing the elastic potential energy. When the engaging portions 923 is across the first holding portions 210, the elastic components 930 release their elastic potential energy to cause the engaging surfaces 9231 of the engaging portions 923 to engage with the first holding surfaces 211 of the first holding portion 210 so that the insertion device 90 is maintained at the installed position.

In the latter case that the user wants to take the insertion device 90 out from the holding device 10, as shown in FIG. 6, the press portions 922 that are located at the lateral sides 913 of the insertion device 90 are located outside of the casing 100 (i.e., the press portions 922 of the engaging components 920 are not in the accommodation space S), which allows the user to press the press portions 922 inward to cause the engaging surfaces 9231 of the engaging portions 923 of the engaging components 920 to disengage from the second holding surfaces 221 of the second holding portions 220 of the holding device 10 (i.e., the user is able to move the engaging components 920 to the disengaged position), at this moment, the insertion device 90 is removable from the non-installed position and can be completely taken out from the holding device 10.

On the other hand, the insertion device 90 is able to be inserted into the accommodation space S via the insertion opening O of the casing 100. In detail, in this embodiment or some other embodiments, the second holding portions 220 of the holding structures 200 of the holding device 10 each have a second inclined guide surface 222, similar to the first inclined guide surfaces 212 of the first holding portions 210, the second inclined guide surface 222 faces away from the second holding surface 221 and faces the insertion opening O of the casing 100. While the insertion device 90 is pushed into the accommodation space S via the insertion opening O of the casing 100, the inclined contact surfaces 9232 of the engaging portions 923 of the insertion device 90 will firstly contact the second inclined guide surfaces 222 of the second holding portions 220 of the holding structure 200, similar to the first inclined guide surfaces 212 of the first holding portion 210, the second inclined guide surfaces 222 of the second holding portions 220 can force the engaging portions 923 of the engaging components 920 to move toward the device main body 910 and cause the elastic components 930 to store elastic potential energy. When the engaging portions 923 are across the second holding portions 220, the elastic components 930 will release their elastic potential energy to move the engaging portions 923 away from the device main body 910. And then the insertion device 90 can be in the non-installed position or being further pushed toward the installed position, and similar descriptions will not be repeated.

Accordingly, if the insertion device 90 is accidentally or unwantedly detached from the installed position, the second holding portions 220 of the holding device 10 will be able to prevent the insertion device 90 from directly falling out of the holding device 10. Unless the user intentionally presses the engaging components 920 of the insertion device 90 to release the insertion device 90 from the second holding portions 220, the insertion device 90 will still be firmly fixed on the holding device 10. In other words, it requires two steps to release the insertion device 90 from the holding device 10, the first step is to press the releasing components 300 of the holding device 10 to cause the engaging components 920 of the insertion device 90 to disengage from the first holding portions 210 of the holding device 10, and the second step is to press the engaging components 920 of the insertion device 90 to cause the engaging components 920 to disengage from the second holding portions 220 of the holding device 10.

In addition, please refer back to FIG. 2, the holding device 10 may further include at least one protection component 600 and at least one fastener 700. In this embodiment, the holding device 10 has two groups of protection components 600 and two fasteners 700, and these groups are substantially symmetrical in configuration, so only one of them will be described in detail hereinafter.

In detail, the protection component 600 may be a J-shaped or U-shaped object, and the protection component 600 can be disposed next to the insertion opening O of the casing 100 and covers part of the casing 100. In this embodiment, the protection component 600 is made of, for example, metal or other materials that is harder than that of the casing 100 of the device main body 910 of the insertion device 90. The protection component 600 is decorative and is also able to protect the casing 100 from being hit by the insertion device 90 during the removal or insertion of the insertion device 90.

In more detail, the protection components 600 are disposed on an insertion side surface 110 of the casing 100 which surrounds the insertion opening O, and the protection component 600 has a protection surface 610. The protection surface 610 faces away from the first holding portion 210 and the second holding portion 220 of the holding structure 200. The second holding portion 220 is located between the first holding portion 210 and the protection surface 610, and the protection surface 610, the first holding portion 210 and the second holding portion 220 are located at the same side of the casing 100. Therefore, when the insertion device 90 is about to be inserted into the insertion opening O of the casing 100, the protection surface 610 of the protection component 600 can protect the casing 100 from being hit by the insertion device 90.

In addition, the protection component 600 may further have a fixing hole 601 corresponding to the fixing hole 105 of the casing 100 and the fixing hole 204 of the holding component 20. And the fastener 700 can be disposed through the fixing hole 601, the fixing hole 105 and the fixing hole 204 so as to fix the protection component 600, the casing 100, and the holding component 20 together. The protection component 600 and the fastener 700 are optional; in some other embodiments, the holding device may not have the aforementioned protection component 600 and fastener 700.

Further, in the electronic device assembly 1 in the previous embodiments, the holding structures 200, the holding components 20, the releasing components 300, the protection components 600 and the fasteners 700 of the holding device 10 and the engaging components 920 and the elastic components 930 of the insertion device 90 are plural and disposed on two opposite sides of the electronic device assembly 1, but the disclosure is not limited to their quantities. In some other embodiments, the above components can be singular; in such a case, they can be disposed on the same side of the electronic device assembly, that is, only one side of the electronic device assembly has the holding structure and that still can use the second holding portion to maintain the insertion device at the non-installed position.

Lastly, please refer to FIG. 7, FIG. 7 is a simple diagram of an electronic apparatus 2 according to one embodiment of the disclosure. The electronic apparatus 2 may be, but not limited to, a handheld electronic product, such as an industrial mobile phone. The disclosure is not limited to the type or shape of the electronic apparatus 2 so that the electronic apparatus 2 is presented in a simple manner. In FIG. 7, the electronic apparatus 2 includes the aforementioned casing 100, the holding structures 200 disposed on the casing 100, and electrical devices, such as a processing unit 81, a memory 82 and a display 83, that are disposed in the casing 100, and the electronic apparatus 2 is able to accommodate and fix the aforementioned insertion device 90. The casing 100 can be considered as the outer casing of the electronic apparatus 2, such that it may have the aforementioned releasing components 300 or protection components 600. And the detail of the insertion device 90 may be the same as that are described in the above paragraphs but are omitted due to the simple manner of FIG. 7, such that it is understood that this embodiment is not limited to the insertion device 90. Similarly, the insertion device 90 can be inserted into the casing 100 of the electronic apparatus 2 and moved to the installed position, such that the insertion device 90 will be electrically connected to the processing unit 81, the memory 82 and the display 83 so as to provide its function (e.g., electricity) to these electronic devices. Depending on the type or requirement of the electronic apparatus 2, it is understood that the electronic apparatus 2 can be selectively equipped with the aforementioned processing unit 81, memory 82 and display 83 or additionally equipped with other electronic devices, such as antenna or microphone, and the disclosure is not limited thereto.

According to the holding device, the electronic device assembly, and the electronic apparatus discussed above, the second holding portion of the holding structure of the holding device is located closer to the insertion opening than the first holding portion. Therefore, the insertion device can be held by the first holding position when it is accommodated in the casing of the holding device, and when the insertion device is accidentally or unwantedly released from the first holding portion, the second holding portion will hold it at the non-installed position and prevent it from directly falling out of the holding device. As such, the insertion device is prevented from missing or being damaged if it falls on the ground.

In addition, in one embodiment, the holding device may include at least one protection component that is disposed on the insertion side surface which surrounds the insertion opening of the casing, the protection component is not only decorative but also able to protect the casing from being hit by the insertion device during the removal or insertion of the insertion device.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. An electronic device assembly, comprising:
    a holding device, comprising:
        a casing, having an insertion opening; and
        at least one holding structure, each of the at least one holding structure comprising a first holding portion and a second holding portion, wherein the second holding portion is located closer to the insertion opening than the first holding portion;
    an insertion device, at least part of the insertion device is configured to be removably accommodated in the casing so that the insertion device has an installed position and a non-installed position, wherein the insertion device comprises a device main body and at least one engaging component, the at least one engaging component is connected to the device main body, the first holding portion of the at least one holding structure is configured to engage with the at least one engaging component of the insertion device so as to hold the insertion device at the installed position; and the second holding portion of the at least one holding structure is configured to engage with the at least one engaging component of the insertion device so as to hold the insertion device at the non-installed position; and
    at least one releasing component, each comprising an elastic arm and a press block, wherein the press block is movably connected to the casing via the elastic arm and has a pushing portion that is located near a side of the first holding portion away from the second holding portion and configured to push the at least one engaging component of the insertion device so as to release the at least one engaging component from the first holding portion.

2. The electronic device assembly according to claim 1, further comprising at least one protection component, the casing having an insertion side surface, wherein the insertion opening is formed at the insertion side surface, the at least one protection component is disposed on the insertion side surface, the at least one protection component has a protection surface, and the second holding portion is located between the first holding portion and the protection surface.

3. The electronic device assembly according to claim 1, wherein the at least one holding structure is made of a single piece.

4. The electronic device assembly according to claim 1, wherein an quantity of the at least one holding structure is two, the two holding structures are respectively located at two opposite sides of the casing, an quantity of the at least one engaging component is two, the two engaging components are respectively located at two opposite sides of the device main body; a distance between the first holding portions of the two holding structures is L1; a distance between the second holding portions of the two holding structures is L2; when the insertion device is in the installed position or the non-installed position, a furthest distance between outer sides of the two engaging components is D; and the following condition is satisfied:

L1<D; L2<D.

5. The electronic device assembly according to claim 1, wherein each of the at least one engaging component has a connecting portion, a press portion and an engaging portion, the press portion is connected to the device main body via the connecting portion, and the engaging portion is connected to the connecting portion via the press portion; when the insertion device is in the non-installed position, the press portion is located outside of the casing.

6. The electronic device assembly according to claim 5, wherein the insertion device further comprises at least one elastic component, clamped between the press portion and the device main body and configured to force the press portion and the engaging portion to move always from the device main body.

7. The electronic device assembly according to claim 5, wherein the connecting portion is pivotally connected to the device main body.

8. The electronic device assembly according to claim 1, wherein the insertion device is a battery.

9. A holding device, configured to hold an insertion device so that the insertion device has an installed position and a non-installed position, the holding device comprising:
    a casing, having an insertion opening, wherein the casing is configured to accommodate at least part of the insertion device;
    at least one holding structure, each of the at least one holding structure comprising a first holding portion and a second holding portion, the second holding portion is located closer to the insertion opening than the first holding portion; wherein the first holding portion of the at least one holding structure is configured to engage with the insertion device so as to hold the insertion device at the installed position; and the second holding portion of the at least one holding structure is configured to engage the insertion device so as to hold the insertion device at the non-installed position; and
    at least one releasing component, each comprising an elastic arm and a press block, wherein the press block is movably connected to the casing via the elastic arm and has a pushing portion that is located near a side of the first holding portion away from the second holding portion and configured to push at least one engaging component of the insertion device so as to force the at least one engaging component to disengage from the first holding portion.

10. The holding device according to claim 9, further comprising at least one protection component, the casing having an insertion side surface, wherein the insertion opening is located at the insertion side surface, the at least one protection component is disposed on the insertion side surface, the at least one protection component has a protection surface, and the second holding portion is located between the first holding portion and the protection surface.

11. The holding device according to claim 10, wherein the casing has at least one exposure hole, and a side of the press block facing away from the pushing portion is exposed from the at least one exposure hole.

12. The holding device according to claim 9, wherein the at least one holding structure is made of a single piece.

13. The holding device according to claim 9, wherein a quantity of the at least one holding structure is two, the two holding structures are respectively located at two opposite sides of the casing, a quantity of the at least one engaging component is two, the two engaging components are respectively located at two opposite sides of a device main body of the insertion device; a distance between the first holding portions of the two holding structures is L1; a distance between the second holding portions of the two holding structures is L2; when the insertion device is in the installed position or the non-installed position, a furthest distance between outer sides of the two engaging components is D; and the following condition is satisfied:

L1<D; L2<D.

14. An electronic apparatus, comprising:
a casing, having an insertion opening;
an insertion device, at least part of the insertion device is configured to be removably accommodated in the casing so that the insertion device has an installed position and a non-installed position, wherein the insertion device comprises a device main body and at least one engaging component, the at least one engaging component is connected to the device main body and each have a connecting portion, a press portion and an engaging portion, the press portion is connected to the device main body via the connecting portion, and the engaging portion is connected to the connecting portion via the press portion;
at least one holding structure, each of the at least one holding structure comprising a first holding portion and a second holding portion, the second holding portion is located closer to the insertion opening than the first holding portion; wherein the first holding portion of the at least one holding structure is configured to engage with the insertion device so as to hold the insertion device at the installed position; and the second holding portion of the at least one holding structure is configured to engage with the insertion device so as to hold the insertion device at the non-installed position; when the insertion device is in the non-installed position, the press portion of the at least one engaging component of the insertion device is located outside of the casing; and
a processing unit, disposed in the casing, when the insertion device is in the installed position, the insertion device is electrically connected to the processing unit.

15. The electronic apparatus according to claim 14, wherein the first holding portion of the at least one holding structure is configured to engage with the at least one engaging component of the insertion device so as to hold the insertion device at the installed position; and the second holding portion of the at least one holding structure is configured to engage with the at least one engaging component of the insertion device so as to hold the insertion device at the non-installed position; the electronic apparatus further comprises at least one releasing component, movably disposed on the casing and configured to release the at least one engaging component of the insertion device.

16. The electronic apparatus according to claim 15, wherein the at least one releasing component comprises an elastic arm and a press block, the press block is movably connected to the casing via the elastic arm, the press block has a pushing portion, located near a side of the first holding portion away from the second holding portion and configured to push the at least one engaging component of the insertion device so as to force the at least one engaging component to disengage from the first holding portion.

* * * * *